US00RE35766E

United States Patent [19]

Taguchi

[11] E Patent Number: Re. 35,766

[45] Reissued Date of Patent: Apr. 7, 1998

[54] STABILIZED-FEEDBACK CONTROL DEVICE FOR SEMICONDUCTOR LASERS

[75] Inventor: Toyoki Taguchi, Yokohama, Japan

[73] Assignee: Kabushiki Kaisha Toshiba, Kawasaki, Japan

[21] Appl. No.: 154,123

[22] Filed: Nov. 18, 1993

Related U.S. Patent Documents

Reissue of:

[64] Patent No.: 5,097,473
Issued: Mar. 17, 1992
Appl. No.: 630,500
Filed: Dec. 20, 1990

[30] Foreign Application Priority Data

Dec. 21, 1989 [JP] Japan ..... 1-329514

[51] Int. Cl.[6] ..... H01S 3/10

[52] U.S. Cl. ..... 372/38; 372/31

[58] Field of Search ..... 372/38, 29, 31

[56] References Cited

U.S. PATENT DOCUMENTS

| | | | |
|---|---|---|---|
| 4,536,715 | 8/1985 | Basarath et al. | 330/2 |
| 4,945,541 | 7/1990 | Nakayama | 372/31 |
| 4,995,105 | 2/1991 | Wechsler | 372/38 |
| 5,018,154 | 5/1991 | Ohashi | 372/29 |

FOREIGN PATENT DOCUMENTS

| | | |
|---|---|---|
| 0177166 | 4/1986 | European Pat. Off. . |
| 57-99834 | 6/1982 | Japan . |
| 58-182144 | 10/1983 | Japan . |
| 1481815 | 8/1977 | United Kingdom . |

OTHER PUBLICATIONS

G. B. Clayton, "Feed Forward Frequency Compensation" Chapter 2, Sec. 7-2, *Operational Amplifiers*, 1979 (No month).

J. Beck et al, "Optical Component Design for a Correlation--Based Optical Time-Domain Reflectometer", *Hewlett-Packard Journal*, vol. 39, No. 6, pp. 22-28, Dec. 1988.

N. Ohkawa, "20 GHz Bandwith Low-Noise HEMT Preamplifier For Optical Receivers", *Electronics Letters*, vol. 24 No. 17, pp. 1061-1062 Aug. 18, 1988.

*Primary Examiner*—James W. Davie
*Attorney, Agent, or Firm*—Oblon, Spivak, McClelland, Maier & Neustadt, P.C.

[57] ABSTRACT

A semiconductor laser control apparatus includes a semiconductor laser, a current driver connected to the semiconductor laser, a semiconductor p-i-n photodiode for generating a monitoring current, and an operational amplifier. The inverting input of the operational amplifier receives a modulated or control signal through a resistor and a feedback current based on the monitoring current. The non-inverting input of the operational amplifier receives a reference signal. When a variation in output light amount of the semiconductor laser occurs, the operational amplifier generates an error signal in accordance with the feedback current and supplies the error signal to the current driver, thereby compensating for the variation in output light amount of the semiconductor laser.

30 Claims, 8 Drawing Sheets

STABILIZED-FEEDBACK CONTROL DEVICE FOR SEMICONDUCTOR LASERS

Matter enclosed in heavy brackets [ ] appears in the original patent but forms no part of this reissue specification; matter printed in italics indicates the additions made by reissue.

*This application is a Reissue of U.S. Ser. No. 07/630,500, U.S. Pat. No. 5,097,473.*

BACKGROUND OF THE INVENTION

1. Field of the Invention

The present invention relates to drive control apparatuses for solid-state light-emitting devices and, more particularly, to semiconductor laser apparatuses used for highly advanced electronic equipments such as an optical data communication system, an optical information record/reproduction apparatus, and an optical hard copy generator *generally known as "laser printer"*.

2. Description of the Related Art

Along with increasing demands for higher performance and higher reliability of the recent electronic equipments, strong demand has arisen for developing a semiconductor laser serving as a light source for emitting a light beam representing analog or digital information. Contradictory technical problems, i.e., an increase in data capacity vs. a high data transfer speed, lie in these electronic equipments. In order to solve these problems, an apparatus for driving and controlling a semiconductor laser to maintain an actual output light amount of the semiconductor laser at a stable optimal level has much room for improvement in control performance such as precision of intensity modulation.

Semiconductor lasers have many advantages: intensity modulation can be directly modulated; the size is small; power consumption is low; and emission efficiency of the laser beam is excellent. Therefore, semiconductor lasers are currently used in a variety of applications as in an optical data communication system, an optical information record/reproduction apparatus, and an optical hard copy generator. Presently available semiconductor laser apparatuses, however, are susceptible to abrupt variations in output light amount and deterioration over time.

The variations in output light amount of the laser beam are mainly caused by:

(1) changes in differential quantum efficiency caused by changes in ambient temperature and deterioration over time;

(2) changes in oscillation threshold value adversely affected by temperature changes and/or its own reflected light (return light) component; and (3) noise caused by the return component (this noise is known as "mode hopping noise"). In order to suppress or inhibit the variations in output light amount of the semiconductor laser, the semiconductor laser apparatus must have higher laser beam intensity modulation precision to eliminate various factors for varying the output light amount.

An existing semiconductor laser control apparatus is conventionally provided with a photodetector for monitoring laser output light, such as a photodiode. A detection signal from the monitoring photodetector is converted by using a resistor and the like into a monitor voltage signal representing an actual output light amount. A monitor voltage signal is supplied to an operational amplifier. The operational amplifier compares a reference voltage signal representing a desirable output light amount with the monitor voltage signal. If a difference between these two input signals is detected, an error signal corresponding to this difference is generated by the operational amplifier. The error signal is fed back to a semiconductor laser driver, so that the output light amount of the semiconductor laser is corrected to come close to the reference level.

With such an arrangement, however, a controllable frequency range of the control apparatus is kept low and precision of laser beam intensity modulation is not necessarily satisfactory. In the near future, the control apparatus may not be able to satisfactorily cope with applications to large-capacity, high-speed data processing systems due to the following three reasons. First, the presence of a junction capacitance of the monitoring photodetector will limit expansion of the control frequency range. Second, low-pass filter (LPF) characteristics of the monitoring photodetector also interfere with expansion of the control frequency range. Third, an increase in transmission time of a feedback signal necessarily generated within a control loop of a semiconductor laser may cause a decrease in phase margin of the control system.

In "High-Performance Rewritable Optical Data Recording Technique", Mitsubishi Denki Gijitsu Koho, Vol. 7, pp. 26–29, 1988, a semiconductor control circuit applied to an optical disk system so as to perform two different laser oscillation stabilization operations is disclosed. This control circuit employs a narrow control frequency range feedback (closed loop) control system for compensating a threshold value of a semiconductor laser and employs an open loop control system for variations in differential quantum efficiency. According to these two types of laser oscillation stabilization control schemes, since independent circuit arrangements are required for the respective control systems in principle, the arrangement of the apparatus is undesirably complicated as a whole. More importantly, in an optical data recording mode, a housing of a head unit which stores the semiconductor laser is heated due to a temperature change caused by variations in differential quantum efficiency. As a result, the precision of light intensity modulation is degraded. This degradation causes decisive degradation of performance in laser stabilization control. Therefore, this prior art is expected to be not capable of coping with future increases in capacity and speed of optical disk systems.

SUMMARY OF THE INVENTION

It is, therefore, an object of the present invention to provide a new and improved semiconductor laser apparatus excellent in performance of laser oscillation stabilization control.

It is another object of the present invention to provide a new and improved semiconductor laser apparatus which can minimize a necessary circuit arrangement and is in excellent in performance of laser oscillation stabilization control.

In accordance with the above objects, the present invention aims at maximizing a controllable frequency range of an output light amount control system of a semiconductor laser, and eliminating an extra or optional circuit arrangement and improving precision of laser beam intensity modulation by expansion of this control frequency range. More specifically, according to a control apparatus for stabilizing and controlling the output light amount of a solid-state light-emitting device, a current driver supplies a drive current to the light-emitting device to designate desired light emission in accordance with an externally supplied control voltage signal. A photodetector receives at least partly the output light from the light-emitting device and generates a detection current signal representing its own detected light amount. A light amount variation compensator is connected to the current driver and the photodetector. When a variation occurs in the output light amount of the light-emitting device, the light amount variation compensator generates an electrical error signal for compensating for this variation in response to the detection current signal and supplies the error signal to the current driver. A resistive element is connected to the input of the light amount variation compensator. The light amount variation compensator receives a control voltage signal through the resistive element, detects a difference between the control current signal flowing through the resistive element and the detection current signal if any, and generates a voltage signal corresponding to this detected difference as the error signal.

The present invention and its objects and advantages will be more apparent in a detailed description of preferred embodiments presented below.

BRIEF DESCRIPTION OF THE DRAWINGS

In the detailed description of preferred embodiments of the present invention presented below, reference is made to the accompanying drawings, in which.

DETAILED DESCRIPTION OF THE PREFERRED EMBODIMENTS

Figure 1:
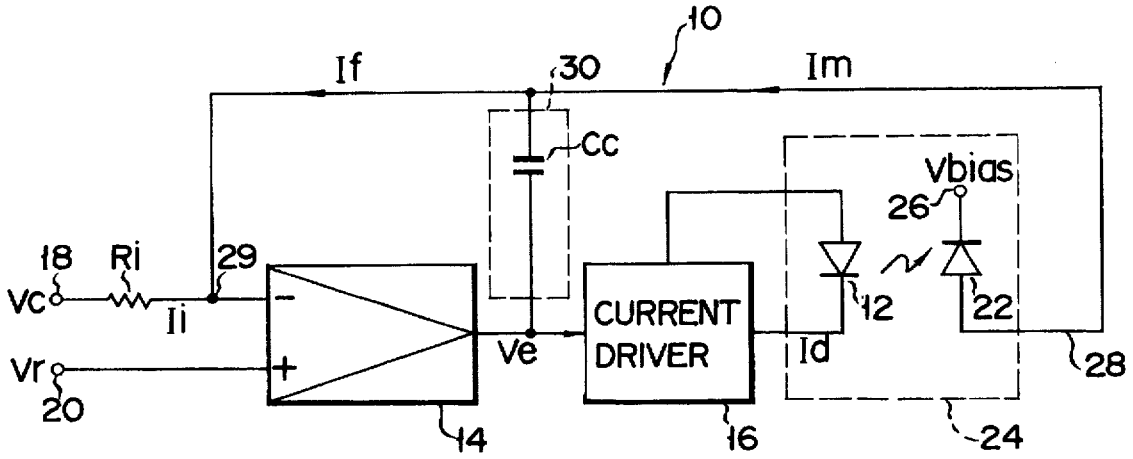
FIG. 1 is a schematic block diagram showing an overall arrangement of a semiconductor laser control apparatus according to an embodiment of the present invention.

A semiconductor laser control apparatus according to one preferred embodiment of the present invention is generally designated by reference numeral 10. This apparatus receives an electrical input signal for designating emission of a semiconductor laser 12, e.g., an intensity-modulated signal Vc representing digital information and operates the semiconductor laser 12 in response to the intensity-modulates signal Vc, thereby externally emitting or sending forth an optical signal.

The semiconductor laser 12 is associated with an operational amplifier 14 and a current driver 16. The above input signal (modulated signal or control signal) Vc is externally supplied to a first input terminal 18. A second input terminal 20 receives a reference voltage signal Vr which defines a reference potential level of the control signal Vc. The operational amplifier 14 receives the reference voltage signal Vr at its non-inverting input and the control signal Vc at its inverting input. It is very important that a resistor Ri is arranged between the input terminal 18 and the inverting input of the operational amplifier 14. A current signal supplied to the operational amplifier 14 through the input resistor Ri is represented by Ii. The output of the operational amplifier 1 is connected to the current driver 16. The current driver 16 supplies a drive current Id to the semiconductor laser 12, thereby exciting the semiconductor laser 16. The current driver 16 has a frequency range at least three times or more the control frequency range of the control apparatus 10.

A photodetector 22 is arranged near the semiconductor laser 12 so that the photodetector 22 partially (e.g., light of about 3% of the total output light amount) detects a laser beam emitted by the semiconductor laser 12 and generates as a monitor output signal a current signal Im having a current level proportional to the detected actual output light amount. The photodetector 22 may be a semiconductor p-i-n junction photodiode. The monitoring photodiode 22 is arranged together with the semiconductor laser 12 within a laser pickup represented by a block of a broken line 24 in FIG. 1. The monitoring photodiode 22 is constantly supplied with a DC bias voltage Vbias at a terminal 26. Since a resistive element for converting the monitor output current signal Im from the photodetector 22 into a voltage is not connected to the output stage of the photodetector 22, the monitor current signal Im is transmitted to the operational amplifier 14 through a feedback path 28 while it is maintained in the form of a current.

The monitoring photodiode 22 is connected to the inverting input of the operational amplifier 14 through the feedback path 28. The monitor output current Im from the monitoring photodiode 22 is not converted into a voltage signal and is transmitted onto the feedback path 28 in the form of a current (i.e., a current signal mode).

As shown in FIG. 1, a capacitor Cc is connected between the feedback path 28 and the output of the operational amplifier 14. The capacitor Cc serves as a compensation capacitor for improving the response characteristic of the monitoring photodetector 22 constituted by a p-i-n junction photodiode. The compensation capacitor Cc can be considered to constitute a compensation circuit 30.

A current obtained in the latter stage of the compensation capacitor Cc, i.e., a feedback current If is supplied to a connection node 29 between an input resistor Ri and the inverting input of the operational amplifier 14. When the semiconductor laser 12 unintentionally varies an output light amount, its variation amount is transmitted to the operational amplifier 14 as the feedback current signal If. At this time, a difference is formed between a current flowing through the resistor Ri upon application of the control voltage signal Vc, i.e., a control current Ii and the feedback current If. This current difference causes a difference voltage. This difference voltage is amplified to generate an error voltage signal Ve. The error signal Ve is supplied to the current driver 16. The current driver 16 supplies a drive current modified to compensate for the actual variation or error (i.e., an error in detected output light amount) generated in the output light amount. As a result, the semiconductor laser 12 emits a laser beam having an optimal level.

Figure 2:
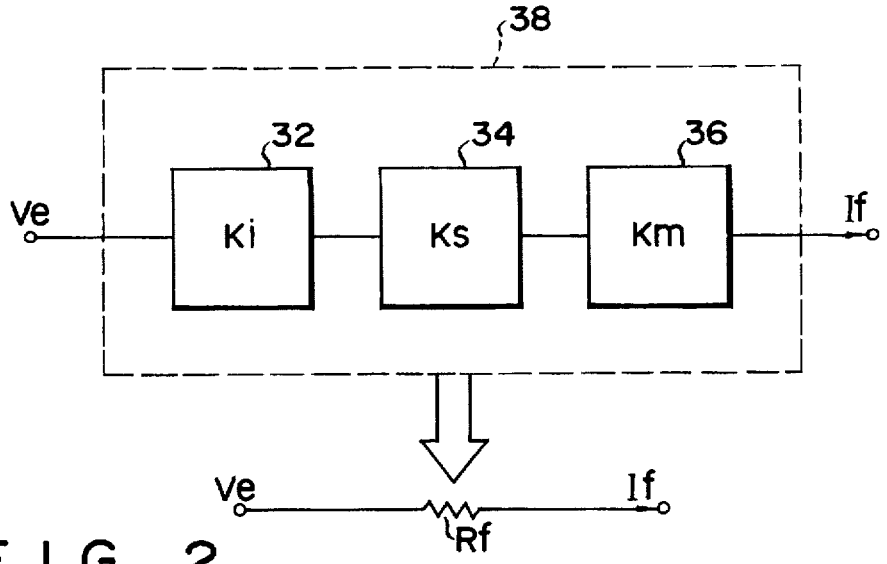
FIG. 2 is a diagram visually illustrating a relationship between a block circuit representing a feedback path of an operational amplifier of the embodiment of FIG. 1 and its equivalent feedback resistor.

The feedback path of the operational amplifier 14 in the above embodiment can be equivalently represented by a block circuit shown in FIG. 2. A block 32 represents a transfer element which represents a conversion gain coefficient Ki (A/V) of the current driver 16 in FIG. 1. A block 34 is a transfer element representing differential quantum efficiency Ks (W/A) of the semiconductor laser 12. A block 36 is a transfer element representing monitor efficiency Km (A/W) of the monitoring p-i-n photodiode 22. A series circuit 38 of the transfer elements 32, 34, and 36 equivalently serves as a feedback resistive element Rf for the operational amplifier 14 due to the following reason. When an output voltage Ve from the operational amplifier 14 is applied to the input terminal of the series circuit of the transfer elements Ki, Ks, and Km, the resultant current (If) is represented as follows:

$$If=Ve\cdot Ki\cdot Ks\cdot Km \quad (1)$$

Therefore, the resistance Rf of the circuit 38 is equivalently defined as follows:

$$Rf=1/Ki\cdot Ks\cdot Km \quad (2)$$

This indicates that the circuit 38 equivalently serves as a "feedback resistive element" Rf of the feedback path for the operational amplifier 14.

Figure 3:
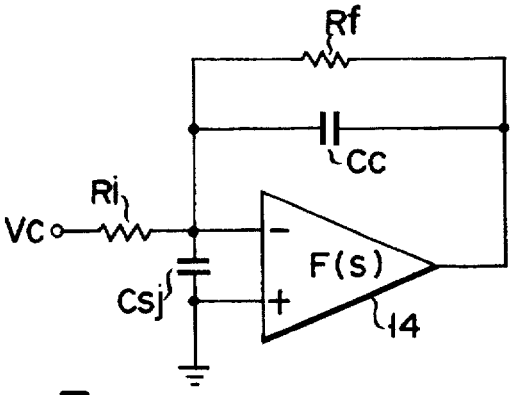
FIG. 3 is a diagram showing an equivalent circuit of the operational amplifier (FIG. 1) having the feedback circuit arrangement.

The feedback circuit arrangement of the operational amplifier 14 is equivalently shown in FIG. 3. In this equivalent circuit, a capacitor Csj connected to the inverting input of the operational amplifier 14 represents its own junction and stray capacitance. With such an arrangement, feedback parameters of the operational amplifier 14 can be adjusted. In addition, necessity of adding the feedback resistive element for the operational amplifier 14 can be eliminated. Therefore, the control circuit arrangement for the semiconductor laser 12 can be simplified.

In the feedback control circuit of FIG. 3, in order to expand the control frequency range, in addition to improvement in the high-frequency range of the operational amplifier 14, (1) The capacitance of the input capacitor Csj of the operational amplifier 14 must be minimized.

(2) The resistances of the input resistor Ri and the equivalent feedback resistor Rf connected to the non-inverting input of the operational amplifier 14 must be minimized.

(3) A transmission delay time of the monitor signal Im and the feedback signal If in the feedback control loop must be minimized (e.g., the phase delay of the transfer signal at a frequency of 50 MHz is increased to 36 degrees when the delay time is 3 nanoseconds, and the response characteristics of the operational amplifier 14 are seriously degraded). In this embodiment, as described above, the monitor output signal (Im) from the monitoring photodiode 22 and the feedback signal (If) are not converted into voltage signals but are supplied to the operational amplifier 14 through the feedback path 28 as current signals. In addition, the feedback resistor Rf for the operational amplifier 14 is not constituted by an actual resistive element, but is substituted by the series circuit 38 of the transfer elements Ki, Ks, and Km equivalently obtained by the semiconductor laser 12, the current driver 16, and the monitoring diode 22. As a result of these characteristics, requirements for a broad frequency range can be successfully satisfied. Therefore, in the control apparatus 10 for controlling an output light amount of the semiconductor laser 12, the control frequency range can be greatly widened, and precision of the laser beam intensity modulation can be improved without increasing the number of extra or optional circuit components.

Figure 4:
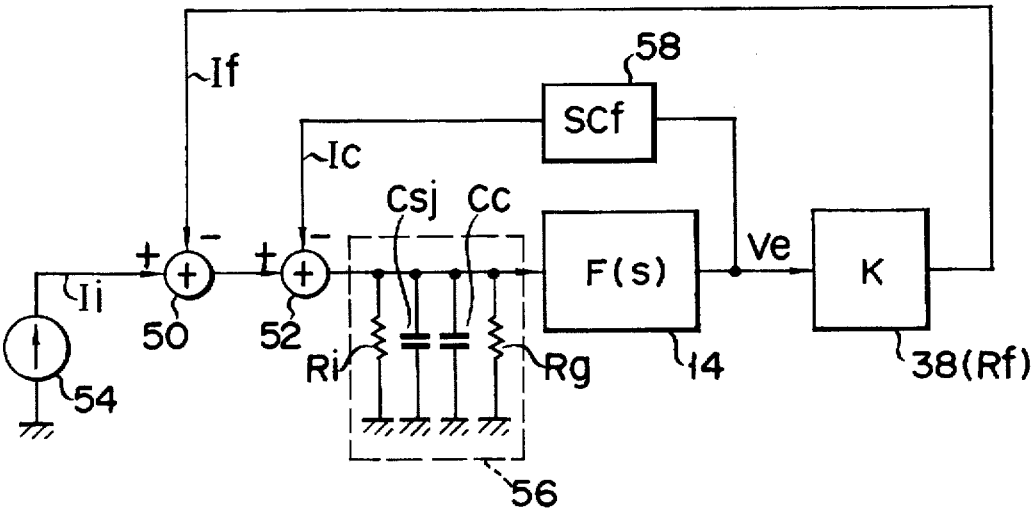
FIG. 4 is a diagram showing a functionally equivalent circuit arrangement obtained by converting the circuit arrangement of the embodiment of FIG. 1 into a current mode.

FIG. 4 shows a circuit arrangement obtained by functionally and equivalently rewriting the semiconductor laser control apparatus 10 of this embodiment into a current mode. Feedback points are represented by current adders 50 and 52. A constant current source 54 is connected to the feedback point 50. An impedance unit 56 is represented by a parallel impedance of the input resistance Ri of the control apparatus 10, the input resistance Rg of the operational amplifier 14, the capacitance Csj, and the compensation capacitance Cc. The feedback current signal If of the operational amplifier 14 is supplied to the first feedback point 50 through the equivalent feedback resistor (Rf). This correction current signal Ic is supplied to the second feedback point 52 through a corrective capacitor 58. A voltage signal representing an output light amount error of the semiconductor laser 12 is generated by current-to-voltage conversion of the current signal If by the resistor If at the second feedback point 52. Note that a pole determined by the parallel impedance 56 is added in the control loop transfer function of the operational amplifier 14. Correction of this pole is simple. As can be readily understood by just viewing FIG. 4, a zero is added to a transfer function F(s) of the operational amplifier 14.

Figure 5:
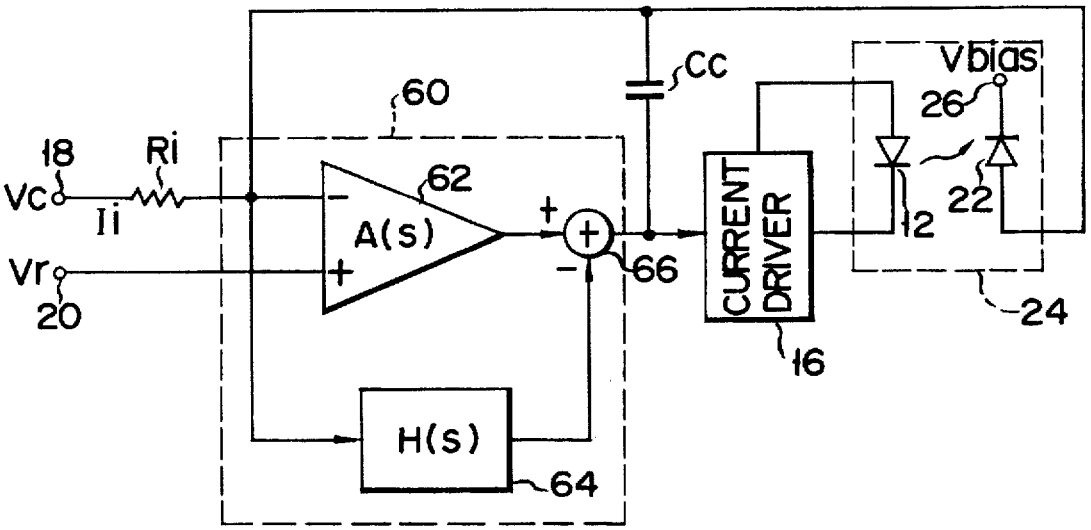
FIG. 5 is a schematic block diagram showing an overall arrangement of a semiconductor laser control apparatus according to another embodiment of the present invention.

Another embodiment of the present invention shown in FIG. 5 has an essential feature in which addition of a zero point to a transfer function F(s) of an operational amplifier 14 is performed by using an additional compensating operational amplifier.

More specifically, as shown in FIG. 5, an operational amplifier unit 60 comprises a general-purpose operational amplifier 62 having a linear low-pass filter characteristic and a compensation operational amplifier 64 having a predetermined high-pass filter characteristic. The non-inverting input of the general-purpose operational amplifier 62 is connected to a terminal 18 through an input resistor Ri, and the resistor 18 receives a modulated signal Vc. The inverting input of the general-purpose operational amplifier 62 is connected to a terminal 20. The terminal 20 receives a reference voltage signal Vr. A current adder 66 is connected to the output of the general-purpose operational amplifier 62. The compensation operational amplifier 64 is connected in parallel with the general-purpose operational amplifier 62. The non-inverting input of the general-purpose operational amplifier 62 is connected to the current adder 66 through the compensation operational amplifier 64. The current adder 66 adds parallel outputs from the operational amplifiers 62 and 64. An output from the current adder 66 is supplied to a current driver 16. Since the general-purpose operational amplifier 62 performs inversion and amplification, a parallel current addition can be performed by subtraction processing in the current adder 66. By this parallel current addition, a zero point can be added to the transfer function F(s) without causing any increase in signal transfer delay.

When the transfer function of the general-purpose operational amplifier 62 is given as A(s), it is defined as follows:

$$A(s)=K\alpha\cdot\omega 1/(s+\omega 1) \quad (3)$$

where ω1 is the pole. When the transfer function of the corrective operational amplifier 64 is given as H(s), it is represented as follows:

$$H(s)=K\alpha\cdot\omega 1\cdot(s+\omega 2)/(s+\omega 1) \quad (4)$$

where ω2 is the zero point. The transfer function F(s) of the operational amplifier unit 60 is defined as:

$$F(s)=H(s)-A(s) \quad (5)$$

A substitution of equations (3) and (4) into equation (5) yields the final transfer function F(s) of the operational amplifier unit 60 as follows:

$$F(s)=(k\alpha\cdot\omega 1/\omega 2)\cdot(s/(s+\omega 1)) \quad (6)$$

Therefore, the corrective operational amplifier 64 is so arranged as to have a linear high-pass filter characteristic with a gain obtained by the first term of the right-hand side of equation (6). The zero point ω2 can be located at a desired position of the transfer function characteristics by adjusting the gain of the compensation operational amplifier 64.

Figure 6:
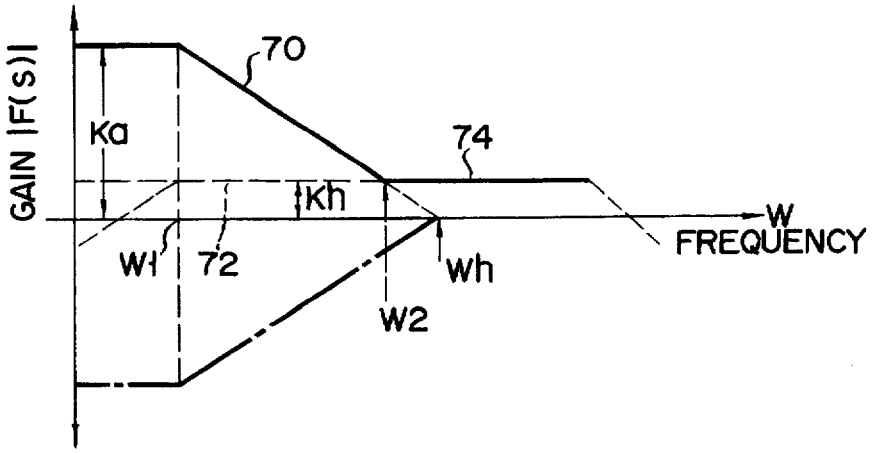
FIG. 6 is a Bode diagram showing the embodiment in FIG. 5.

A Bode diagram shown in FIG. 6 represents a relationship between the above transfer functions. The transfer function A(s) is represented by a line 70. The transfer function F(s) is represented by the line 70 and lines 72 and 74. Referring to this Bode diagram, for example, when a frequency fω2 of the zero point ω2 to be corrected is given as 20 MHz and a gain cross frequency fn of the control loop is given as 60 MHz, which is three times that of the frequency fω2, a gain required for the corrective operational amplifier 64 can be realized by one conventional transistor, as is readily understood by those skilled in the art. If required, it is easy to further shorten the signal transmission delay time in the control loop. In this case, the control frequency range of the semiconductor laser control apparatus can be further expanded. This expansion of the control frequency range can suppress or inhibit normal noise of the semiconductor laser 12 in a broader frequency range. As a result, a signal-to-noise ratio of the laser output beam can be increased. Note that degradation of the response characteristics by the delay time within the control loop can also be prevented since the corrective capacitor Cc advances a signal phase.

Figure 7:
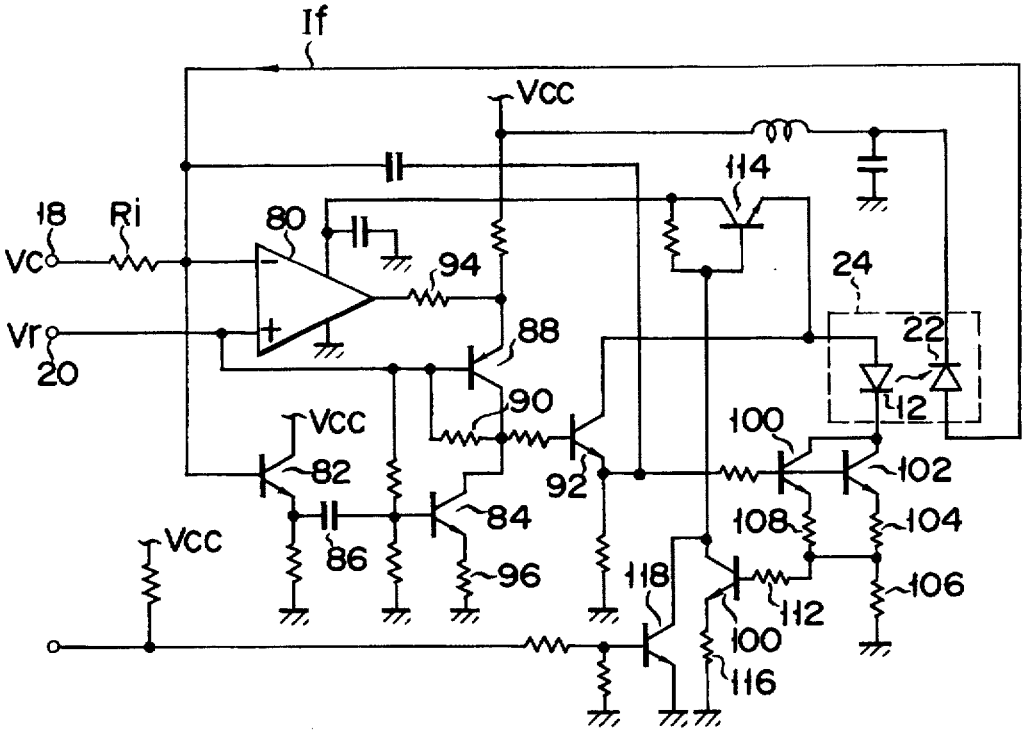
FIG. 7 is a diagram showing a circuit arrangement obtained by actually designing the embodiment of FIG. 5.

A practical circuit arrangement of the embodiment shown in FIG. 5 is shown in FIG. 7. According to this circuit arrangement, a differential operational amplifier 80 constitutes the general-purpose operational amplifier 62 as described above. The compensation operational amplifier 64 in FIG. 5 is mainly constituted by npn transistors 82 and 84 in FIG. 7. A capacitor 86 is inserted between the emitter electrode of the npn transistor 82 and the base electrode of the npn transistor 84. The capacitor 86 defines the linear high-pass filter characteristics described above. The parallel current addition of the current adder 66 in FIG. 6 is performed by a pnp transistor 88 and the npn transistor 84 in FIG. 7. The transistors 88 and 84 simultaneously perform level shift processing. A current sum is detected as a corresponding voltage by a resistor 90. The sum voltage is supplied to the base electrode of an npn transistor 92 serving as a buffer output element. An addition ratio of the general-purpose operational amplifier 62 and the compensation operational amplifier 64 can be adjusted to a desired value by appropriately changing or adjusting the resistances of the resistor 90 and resistors 94 and 96, thereby desirably correcting the transfer function F(s).

The current driver 16 in FIG. 5 is basically constituted by npn transistors 100 and 102 in a practical circuit arrangement in FIG. 7. The collectors of the transistors 100 and 102 are connected to the semiconductor laser 12, thereby current-driving the semiconductor laser 12. A series circuit of resistors 104 and 106 is connected between the emitter electrode of the transistor 102 and ground. A connection node between the resistors 104 and 106 is connected to the emitter electrode of the npn transistor 100 through a resistor 108 and to the base electrode of an npn transistor 110 through a resistor 112. The collector electrode of the npn transistor 110 is connected to the base electrode of an npn transistor 114. The emitter electrode of the npn transistor 114 is connected to the semiconductor laser 12. The resistor 106 serves as a current detection resistor. The npn transistor 110 detects a current actually flowing through the semiconductor laser 12 on the basis of a voltage at the resistor 106. The npn transistor 114 limits a drive current Id supplied to the semiconductor laser 12 in response to the npn transistor 110, if needed. A resistor 116 connected to the emitter electrode of the npn transistor 110 has a function of relaxing the current limiting characteristics. An npn transistor 118 is arranged as an operation controller for the control circuit.

Figure 8:
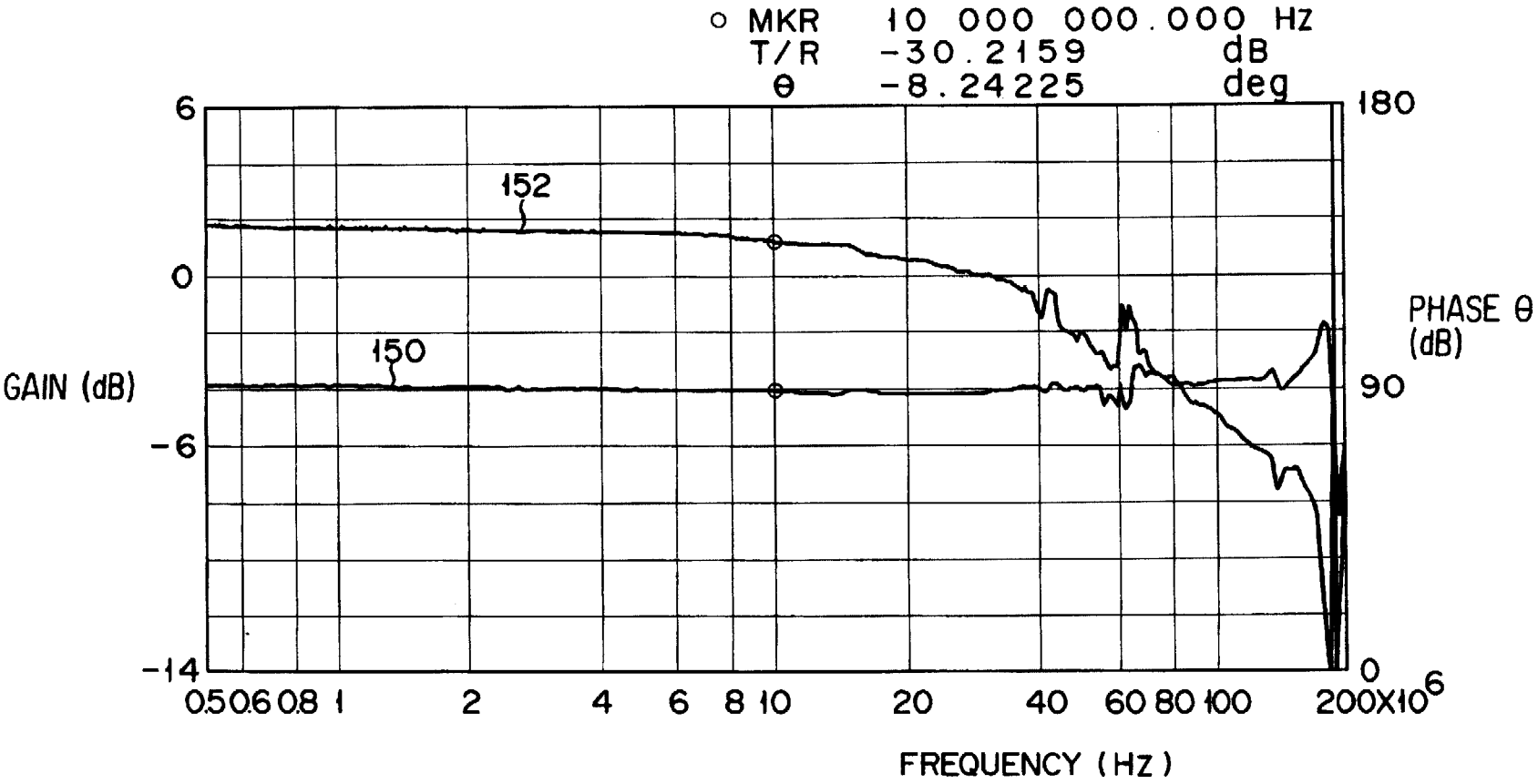
FIG. 8 is a graph showing an experimentally measured transfer frequency characteristic of the semiconductor laser control apparatus in a signal transmission line path between a semiconductor laser and a monitoring photodiode.
Figure 9:
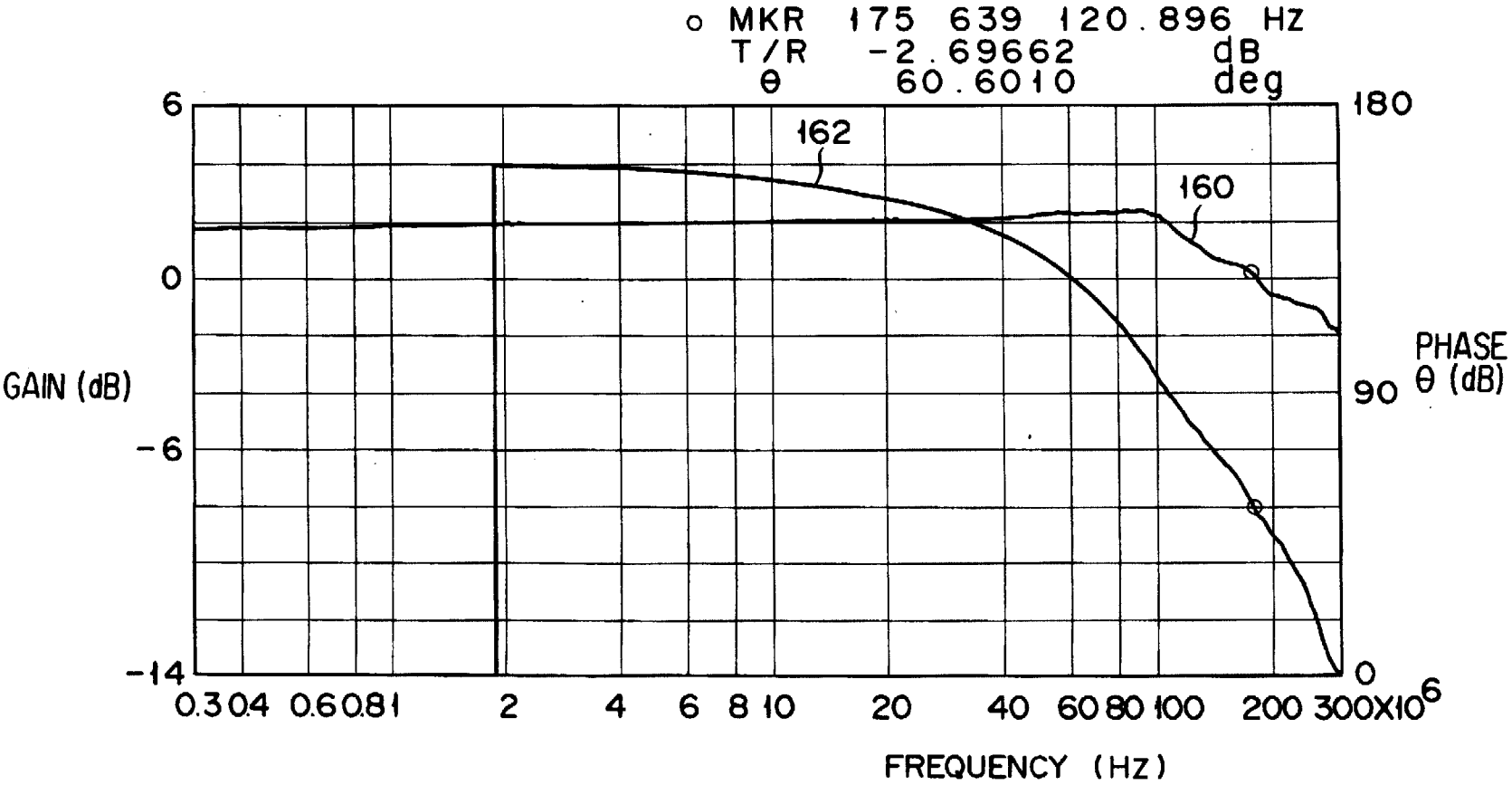
FIG. 9 is graph showing experimental measurement results for demonstrating good feedback control performance of the semiconductor laser control apparatus in a test conducted by the present inventor.

With such a circuit configuration, only four npn transistors are operated near the gain cross frequency of the control loop. This greatly contributes to suppression of delay in signal transmission within the circuit. An experiment actually conducted by the present inventor has demonstrated that the measurement values of delay time can be easily decreased to 1 nanosecond or less. FIGS. 8 and 9 show measurement results of the experiments conducted by the present inventor. The graph in FIG. 8 represents the monitoring light output amplitude and the frequency characteristics at the corresponding phase in the semiconductor laser control loop according to the present invention, wherein a curve 150 represents changes in monitoring amplitude (dB) as a function of frequency, and a curve 152 represents a phase delay 8 (deg.). On the other hand, the graph in FIG. 9 shows the gain and phase characteristics of the operational amplifier, wherein a curve 160 represents changes in gain as a function of frequency, and a curve 162 represents a phase delay 8 (deg.). When values at points P1, P2, P3, and P4 are checked, those skilled in the art would readily understand improvement in control performance of the control apparatus according to the present invention upon examination of the above measurement results.

Figure 10:
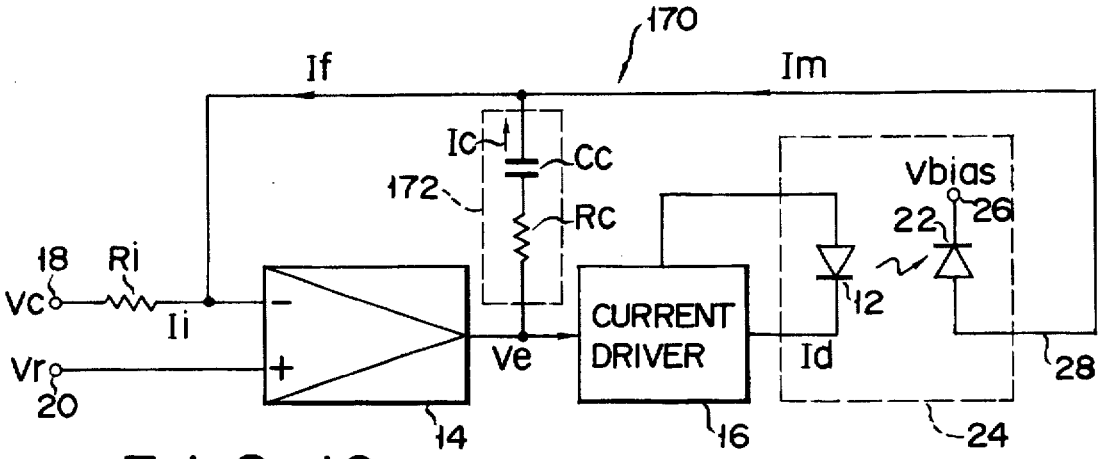
FIG. 10 is a block diagram schematically showing an overall arrangement of a semiconductor laser control apparatus according to still another embodiment of the present invention.

Referring now to FIG. 10, a semiconductor laser control apparatus according to another embodiment of the present invention is generally designated by reference numeral 170. The same reference numerals and symbols as in the embodiment of FIG. 1 denote the same parts in FIG. 10, and a detailed description thereof will be omitted. This apparatus is characterized in that a series circuit of a compensation capacitor Cc and a compensation resistor Rc is arranged between the input of a current driver 16 for driving a semiconductor laser 12 and a feedback path 28, and that this series circuit constitutes a compensation circuit 172. The compensation circuit 172 negatively feeds back a current (to be referred to as a compensation current hereinafter) for further stabilizing the control characteristics of the apparatus 170 to an operational amplifier 14 in accordance with an output voltage Ve from the operational amplifier 14.

The compensation circuit 172 having the capacitor Cc and the resistor Rc has a function of compensating for a signal phase delay caused by the low-pass filter (LPF) characteristics of a monitoring photodetector 22 in addition to the function of compensating for the signal phase delay caused by the delay time in the feedback control loop. That is, the circuit 170 compensates for (1) a phase delay caused by the control loop path extending from the current driver 16 to the monitoring photodetector 22 and the LPF characteristics of the photodetector 22, and (2) a signal phase delay caused by the LPF characteristics defined by a capacitance Csj and an input resistance Ri in an input section, as will be described in detail hereinafter.

A relaxation frequency of the semiconductor laser 12 is generally 1 GHz or more. The response characteristics of an output voltage Ve from the operational amplifier 14 with respect to the control signal Vc are directly reflected on the output light amount of the semiconductor laser 12. In order to expand the control frequency range of the control apparatus 170, only the response characteristics of the operational amplifier 14 for performing inversion and amplification are taken into consideration. The above drawbacks are caused by the response delay of a monitoring feedback current Im from the monitoring photodetector 22 and the high-frequency attenuation characteristics. In order to eliminate the above drawbacks, it is effective to constitute the corrective circuit 172 by a series circuit of the corrective capacitor Cc and the corrective resistor Rc. Since the delay time of the compensation current Ic is negligibly small or zero, the response characteristics of the operational amplifier 14 can be improved by using the above compensation circuit 172.

Figure 11:
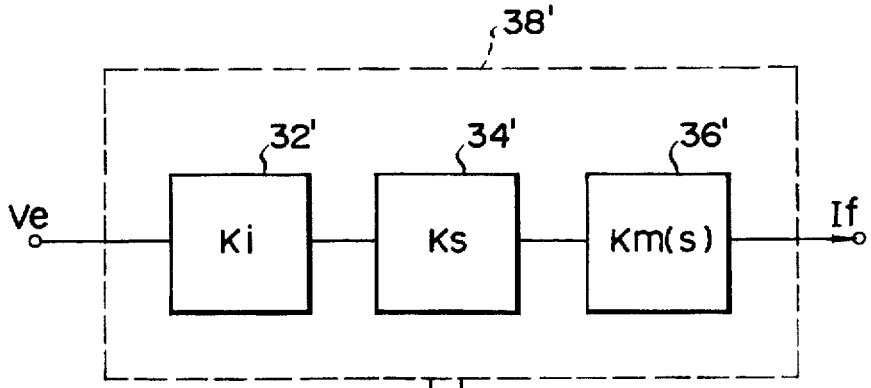
FIG. 11 is a diagram visually illustrating a relationship between a block circuit representing a feedback path of an operational amplifier of the embodiment of FIG. 10 and its equivalent feedback impedance.

The feedback loop for the operational amplifier 14 in the embodiment of FIG. 10 is shown in FIG. 11 in the same manner as in FIG. 2. As can be understood from FIG. 11, the feedback control loop for the operational amplifier 14 can be equivalently constituted by a series respectively having transfer functions Ki, Ks, and Km(s). The circuit 38' can be regarded as a series circuit of the feed back resistance Rf and a feedback inductance Lf.

Improvement in the response characteristics of the operational amplifier 14 will be analyzed below. Referring to FIG. 11, the transfer element 36' representing monitor efficiency Km (A/W) of the monitoring p-i-n photodiode 22 has the above delay time, and the photodiode 22 naturally has LPF characteristics. The transfer function K(m) of the transfer element 36' is given as follows:

$$Km(s)=(Km\cdot\omega d/\omega p)\cdot(s+\omega d)(s+\omega p) \tag{7}$$

where ωd is a pole obtained by linearly approximating the delay time, and ωd represents a pole of the LPF characteristics. When equations (2) and (7) are taken into consideration, a feedback impedance Zf(s) is given as follows:

$$\begin{aligned} Zf(s) &= Rf + sLf \\ &= Rf + s\{Rf\cdot\omega d\cdot\omega p/(\omega d+\omega p)\} \end{aligned} \tag{8}$$

Figure 12:
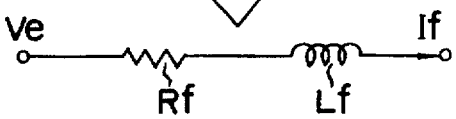
FIG. 12 is a diagram showing a circuit equivalent to the feedback circuit of the operational amplifier in FIG. 10.
Figure 12:
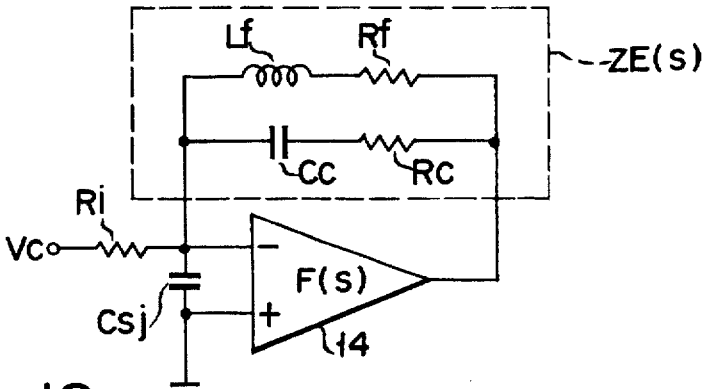

Equation (8) proves that the feedback path for the operational amplifier 14 is equivalent to the series circuit of the resistance Rf and the inductance Lf, as shown in FIG. 11. As shown in FIG. 12, therefore, the semiconductor laser control apparatus 170 can be regarded to be equivalent to an inverting amplifier circuit having the feedback impedance Zt(s).

Referring to FIG. 12, the feedback impedance Zt(s) is represented as follows:

$$Zr(s) = Rc\cdot\frac{s^2+s(Rf/Lf+Rc/Lf)+Rf/RcLc}{s^2+s(Rf/Lf+1/CcRc)+Rf/RcLc} \tag{9}$$

The response characteristics of the operational amplifier 14 can be maximized by setting the left-hand side of equation (9) to 1. Therefore, the feedback resistance Rf and the capacitance Cc of the compensation circuit 172 are determined as follows:

$$Rc=Rf \tag{10}$$

$$Cc=Lf/Rj^a \tag{11}$$

It is very easy to employ the above design technique in the compensation circuit 172. When the corrective circuit 172 is added to the feedback control loop of the operational amplifier 14, the control frequency range of the semiconductor laser control apparatus 170 can be easily broadened. The broad control frequency characteristics facilitate stabilization control of the output light amount of the semiconductor laser 12 and can improve its precision.

Figure 13:
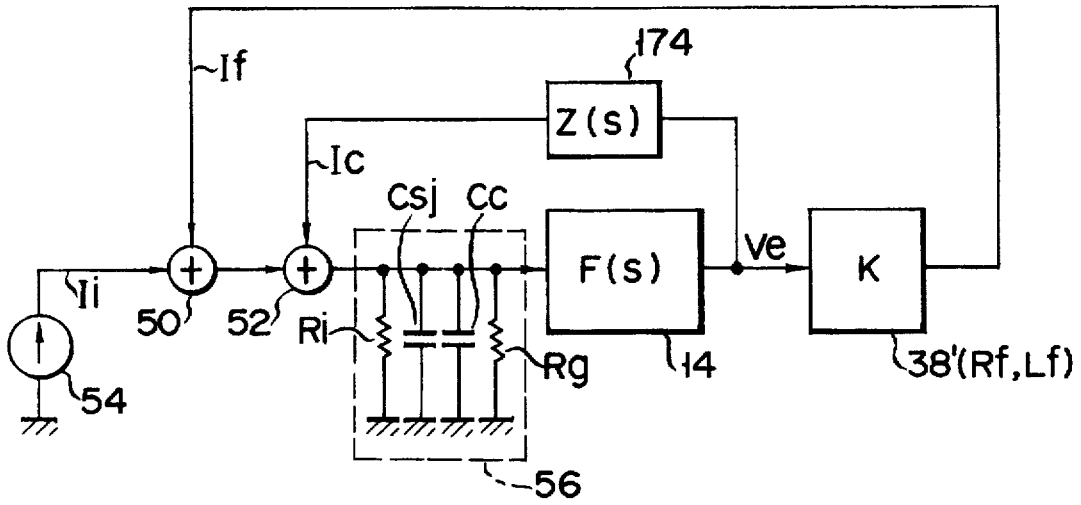
FIG. 13 is a diagram showing a functionally equivalent circuit arrangement obtained by converting the circuit arrangement of FIG. 10 into a current mode.
Figure 14:
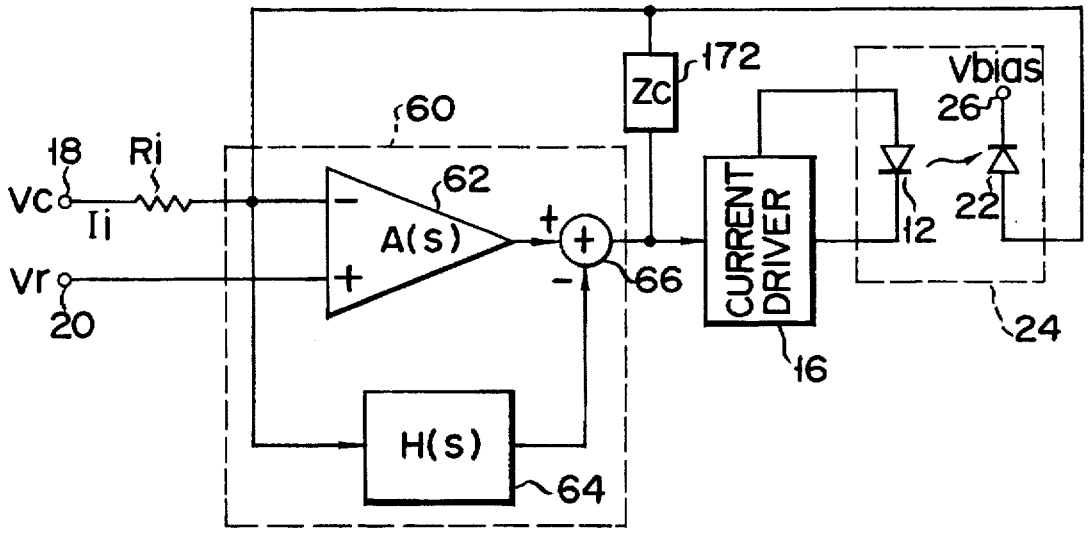
FIG. 14 is a schematic block diagram showing an overall arrangement of a semiconductor laser control apparatus according to still another embodiment of the present invention which employs a corrective circuit shown in FIG. 10 in the embodiment of FIG. 5.

When the circuit arrangement of the embodiment 170 having the compensation circuit 172 is rewritten into a current mode in the same manner as in FIG. 4, a circuit shown in FIG. 13 can be obtained. A block 174 represents a transfer element in an impedance portion corresponding to the circuit 172. When the compensation capacitance Cc in the embodiment of FIG. 5 is replaced with the compensation circuit 172, the circuit arrangement shown in FIG. 14 can be obtained. Zc in the impedance portion representing the circuit 172 represents a composite impedance of the capacitance Cc and the resistance Re.

Figure 15:
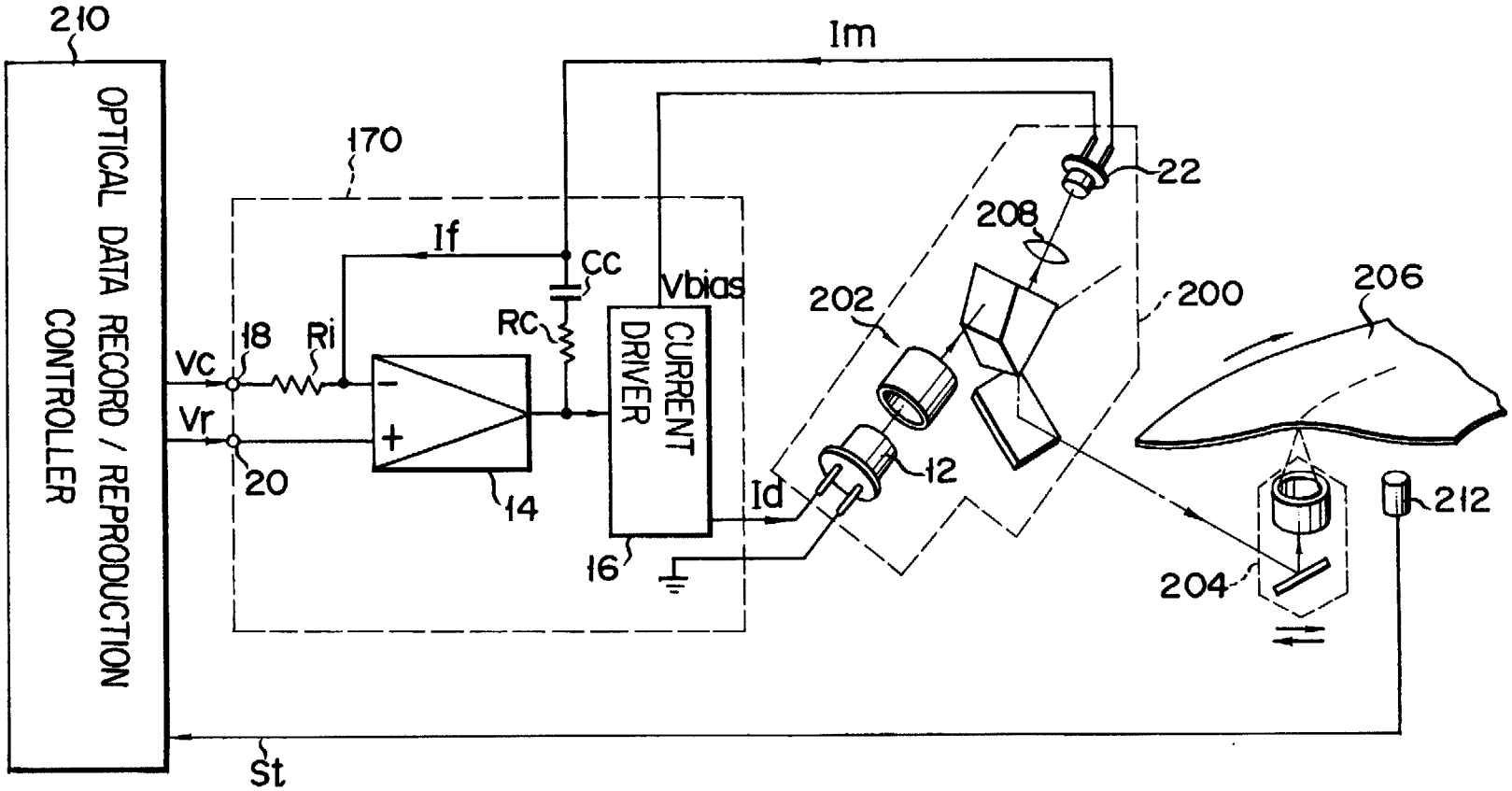
FIG. 15 is a diagram schematically showing an overall arrangement in which the embodiment of FIG. 10 is applied to an optical information record/reproduction apparatus known as an "optical disk".

The embodiments of the present invention can be applied to a variety of high-performance electronic systems. As an example, the semiconductor laser control apparatus 170 of the present invention is applied to an optical information record/reproduction apparatus generally known as an "optical disk drive", as shown in FIG. 15.

The semiconductor laser 12 and the monitoring photodiode 22 are arranged in a fixed optical unit 200. The semiconductor laser 12 emits a laser beam representing optical analog or digital information, which beam is guided to a movable data read/write unit 204 through an optical system 202 including known lenses, composite prisms, and mirrors. The data read/write unit 204 is radially and linearly movable above an optical disk 206 set and rotated on the optical disk drive. When the semiconductor laser 12 emits a weak laser beam for reading out or reproducing information optically stored in the optical disk 206, the read beam is also guided to the optical disk 206 through the optical system 202 and the data read/write unit 204.

A monitoring p-i-n photodiode 22 is arranged in the fixed optical unit 200 to be connected to the semiconductor laser 12 through the optical system 202. A focusing lens 208 is additionally provided in front of the incident surface of the monitoring photodiode. Of all the laser components emitted from the semiconductor laser 12, the lens 208 focuses an optical component directed toward the photodiode 22, thereby improving efficiency of light incident on the photodiode 22. An optimal information record/reproduction control unit 210 is connected to the control apparatus 170 and a temperature sensor 212 located near the surface of the rotating optical disk 206. In accordance with a preselected digital coding scheme, the unit 210 generates a record pulse signal corresponding to information to be recorded and performs waveform equalization. The unit 210 then supplies the control signal Vc to the input terminal 18. The unit 210 optimally updates a reference voltage level Vr of a reference signal in response to an ambient temperature detection signal St from the temperature sensor 212 and supplies the updated level to the input terminal 20 of the control apparatus 170. The control apparatus 170 performs stabilization control of the output light amount of the semiconductor laser 12 by using these signals Vc and Vr.

The present invention is not limited to the above-described specific embodiments and may be practiced or embodied in still other ways without departing from the spirit or essential character thereof.

What is claimed is:

1. A control apparatus for stabilizing and controlling output light of a solid-state light-emitting device, comprising:

driving means for supplying a drive current to said light-emitting device in accordance with an externally supplied control voltage signal representing a desired light emission amount of said light-emitting device;

photodetector means for partly receiving the output light from said light-emitting device and generating a detection current signal electrically representing a detected light amount;

compensating means, connected to said driving means and said photodetector means, for generating an electrical error signal for compensating for a variation, if any, in an output light amount of said light-emitting device in response to the detection current signal, and for supplying the electrical error signal to said driving means; and a resistive element connected to said compensating means, said compensating means receiving the control voltage signal through said resistive element, detecting a difference between a control current signal flowing through said resistive element and the detection current signal, and generating a voltage signal corresponding to a detected difference as the error signal.

2. The apparatus according to claim 1, wherein said compensating means comprises:

an operational amplifier connected to said resistive element and having an input to which the detection current signal is fed back.

3. The apparatus according to claim 1, wherein said compensating means comprises:

an operational amplifier connected to said resistive element and having a first input to which the detection current signal is fed back and a second input to which an electrical signal representing a reference potential level of the control voltage signal is supplied.

4. The apparatus according to claim 3, wherein said operational amplifier has a feedback control loop in which said driving means and said photodetector means are arranged, said driving means and said photodetector means serving as a feedback resistor of said operational amplifier, thereby eliminating an additional resistive element.

5. The apparatus according to claim 4, further comprising:

a compensation capacitor arranged in said feedback control loop of said operational amplifier.

6. The apparatus according to claim 5, wherein said operational amplifier has a transfer function which has a pole for improving low-frequency control characteristics of said operational amplifier and a zero point for compensating for an externally generated control frequency range pole of said operational amplifier.

7. The apparatus according to claim 4, further comprising:

compensation circuit means connected to said operational amplifier, for generating a compensation current in accordance with an output voltage of said operational amplifier, and feeding back the compensation current to said first input of said operational amplifier in addition to the detection current signal.

8. The apparatus according to claim 7, wherein said compensation circuit means comprises:

a series circuit of a capacitor and a resistor.

9. The apparatus according to claim 8, wherein said operational amplifier has a transfer function which has a pole for improving low-frequency control characteristics of said operational amplifier and a zero point for compensating for an externally generated control frequency range pole of said operational amplifier.

10. The apparatus according to claim 8, wherein said light-emitting device comprises a semiconductor laser.

11. A semiconductor laser control apparatus comprising:

a semiconductor laser;

a current driver connected to said semiconductor laser;

photodetector means for monitoring output light of said semiconductor laser and for generating a first current;

a resistive element for receiving a first voltage representing a desired light amount of said semiconductor laser; and an operational amplifier having an inverting input to which the first current is fed back and to which a second current flowing through said resistive element upon application of the first voltage to said resistive element is supplied, a non-inverting input for receiving a second voltage representing a reference level of the first voltage, and an output connected to said current driver.

12. The apparatus according to claim 11, wherein said operational amplifier detects a difference between the first and second currents, and generates a third voltage corresponding to this difference, which is supplied to said current driver.

13. The apparatus according to claim 12, wherein said operational amplifier equivalently uses said semiconductor laser, said current driver, and said photodetector means as a feedback resistance of a feedback loop of said operational amplifier, thereby eliminating an additional resistive element arranged in said feedback loop.

14. The apparatus according to claim 13, further comprising a capacitor connected to said output and said inverting input of said operational amplifier.

15. The apparatus according to claim 13, further comprising:

a series circuit of a capacitor and a resistor which is connected to said output and said inverting input of said operational amplifier.

16. A light beam control apparatus for an optical disk system, comprising:

a solid-state light-emitting device for emitting a light beam focused on a recording surface of an optical disk rotatably set in said optical disk system;

a current driver for supplying a drive current to said light-emitting device;

optical monitoring means for monitoring actual output light from said solid-state light-emitting device and generating a monitoring current;

a resistive element for receiving a first voltage representing a desired light amount of said solid-state light-emitting device; and an operational-amplifier having an inverting input to which the monitoring current is fed back and to which a second current flowing through said resistive element upon application of the first voltage to said resistive element is supplied, a non-inverting input for receiving a second voltage representing a reference level of the first voltage, and an output connected to said current driver.

17. The apparatus according to claim 16, wherein said light-emitting device includes a semiconductor laser.

18. The apparatus according to claim 17, further comprising:

a lens arranged in front of said optical monitoring means, for focusing a light component directed toward said monitoring means.

*19. A light beam control apparatus for an optical hard-copy generation system, comprising:*

*a solid-state light-emitting device for emitting a light beam focused on a target surface rotatably set in said system;*

*a current driver for supplying a drive current to said light-emitting device;*

*optical monitoring means for monitoring actual output light from said solid-state light-emitting device and generating a monitoring current;*

*a resistive element for receiving a first voltage representing a desired light amount of said solid-state light-emitting device; and*

*an operational-amplifier having an inverting input to which the monitoring current is fed back and to which a second current flowing through said resistive element upon application of the first voltage to said resistive element is supplied, a non-inverting input for receiving a second voltage representing a reference level of the first voltage, and an output connected to said current driver.*

*20. The apparatus according to claim 19, wherein said light-emitting device includes a semiconductor laser.*

*21. An optical hard-copy generator comprising a control apparatus for stabilizing and controlling output light of a solid-state light-emitting device, comprising:*

*driving means for supplying a drive current to said light-emitting device in accordance with an externally supplied control voltage signal representing a desired light emission amount of said light-emitting device;*

*photodetector means for partly receiving the output light from said light-emitting device and generating a detection current signal electrically representing a detected light amount;*

*compensating means, connected to said driving means and said photodetector means, for generating an electrical error signal for compensating for a variation, if any, in an output light amount of said light-emitting device in response to the detection current signal, and for supplying the electrical error signal to said driving means; and*

*a resistive element connected to said compensating means, said compensating means receiving the control voltage signal through said resistive element, detecting a difference between a control current signal flowing through said resistive element and the detection current signal, and generating a voltage signal corresponding to a detected difference as the error signal.*

*22. The generator according to claim 21, wherein said compensating means comprises:*

*an operational amplifier connected to said resistive element and having an input to which the detection current signal is fed back.*

*23. The generator according to claim 21, wherein said compensating means comprises:*

*an operational amplifier connected to said resistive element and having a first input to which the detection current signal is fed back and a second input to which an electrical signal representing a reference potential level of the control voltage signal is supplied.*

*24. The generator according to claim 23, wherein said operational amplifier has a feedback control loop in which said driving means and said photodetector means are arranged, said driving means and said photodetector means serving as a feedback resistor of said operational amplifier, thereby eliminating an additional resistive element.*

*25. The generator according to claim 24, further comprising:*

*a compensation capacitor arranged in said feedback control loop of said operational amplifier.*

*26. The generator according to claim 25, wherein said operational amplifier has a transfer function which has a pole for improving low-frequency control characteristics of said operational amplifier and a zero point for compensating for an externally generated control frequency range pole of said operational amplifier.*

*27. The generator according to claim 24, wherein said apparatus further comprises:*

*compensation circuit means connected to said operational amplifier, for generating a compensation current in accordance with an output voltage of said operational amplifier, and feeding back the compensation current to said first input of said operational amplifier in addition to the detection current signal.*

*28. The generator according to claim 27, wherein said compensation circuit means comprises:*

*a series circuit of a capacitor and a resistor.*

*29. The generator-according to claim 28, wherein said operational amplifier has a transfer function which has a pole for improving low-frequency control characteristics of said operational amplifier and a zero point for compensating for an externally generated control frequency range pole of said operational amplifier.*

*30. The generator according to claim 28, wherein said light-emitting device comprises a semiconductor laser.*

* * * * *